(12) United States Patent
Nikaido

(10) Patent No.: US 6,373,107 B1
(45) Date of Patent: Apr. 16, 2002

(54) SEMICONDUCTOR STORAGE DEVICE HAVING FOUR-TRANSISTOR MEMORY CELLS

(75) Inventor: Hirofumi Nikaido, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/689,815

(22) Filed: Oct. 13, 2000

(30) Foreign Application Priority Data

Oct. 18, 1999 (JP) ............................................ 11-295771

(51) Int. Cl.[7] .................. H01L 27/76; H01L 29/94; H01L 31/062; H01L 31/113; H01L 31/119
(52) U.S. Cl. ..................... 257/379; 257/904; 257/903
(58) Field of Search ............................. 257/903, 904, 257/296, 369, 401, 379; 365/188

(56) References Cited

U.S. PATENT DOCUMENTS 5,744,844 A * 4/1998 Higuchi ....................... 257/903
5,886,388 A * 3/1999 Wada et al. ................. 257/903
6,259,623 B1 * 7/2001 Takahashi ................... 365/154

FOREIGN PATENT DOCUMENTS

| JP | 9-270468 | 10/1997 |
|----|----------|---------|
| JP | 10-178110 | 6/1998 |

* cited by examiner

*Primary Examiner*—Tom Thomas
*Assistant Examiner*—Thien F. Tran
(74) *Attorney, Agent, or Firm*—McGinn & Gibb, PLLC

(57) ABSTRACT

First and second transistors of a first conductive type of which sources are connected to two bit lines constituting a pair, respectively. The first and second transistors are disposed in a channel width direction of the transistors and in the longitudinal direction of the four-transistor memory cell on a semiconductor substrate. A third transistor of a second conductive type is provided. A drain of the third transistor is connected to a drain of the first transistor, a gate of the third transistor is connected to a drain of the second transistor and a source of the third transistor is grounded. A fourth transistor of the second conductive type is provided. A drain of the fourth transistor is connected to the drain of the second transistor, a gate of the fourth transistor is connected to the drain of the first transistor and of a source of the fourth transistor is grounded.

10 Claims, 16 Drawing Sheets

SEMICONDUCTOR STORAGE DEVICE HAVING FOUR-TRANSISTOR MEMORY CELLS

BACKGROUND OF THE INVENTION

1. Field of the Invention

The present invention relates to a semiconductor storage device having four-transistor memory cells to save an area.

2. Description of the Related Art

Conventionally, a memory cell of a static random access memory (SRAM) is provided with two access transistors and four driver transistors.

As such an SRAM device, the one with access at a higher speed is proposed (Japanese Patent Laid-Open Publication No. Hei 9-270468). In the conventional SRAM device disclosed in this publication, gate electrodes of six transistors constituting one memory cell are extended substantially in the same direction. Consequently, access can be performed at a high speed since an occupied area of the memory cell is reduced and the bit line length is shortened. Two access transistors in one memory cell are disposed at either end parts of the memory cell, respectively, in the longitudinal direction. Each access transistor is provided with contact plugs for supplying signals from word lines (metal interconnect lines) in the upper layer. Bit lines are extended in the short direction of the memory cell while word lines are extended in the direction perpendicular thereto.

An SRAM device with a reduced element area has been proposed (Japanese Patent Laid-Open Publication No. Hei 10-178110). In the conventional SRAM device disclosed in this publication, gate electrodes of six transistors constituting one memory cell are also extended substantially in the same direction. Two access transistors in one memory cell are disposed at either end parts, respectively, of the memory cell in the longitudinal direction. Contact plugs for supplying signals from word line (metal interconnect line) in the upper layer to the access transistors are shared between two neighboring memory cells. Therefore, two memory cells have two contact plugs each. In this conventional SRAM device, word lines are extended in the longitudinal direction of the memory cell while the bit lines are extended in the direction perpendicular thereto.

Recently, an SRAM cell composed of four transistors has been proposed (Japanese Application Publication No. Hei 10-346149). FIG. 1 is a circuit diagram showing a conventional SRAM cell.

In the conventional SRAM cell composed of four transistors, in one memory cell provided are access transistors Tr101 and Tr102 of which sources are connected to two bit lines BL101 and BL102, respectively, constituting a bit line pair. The access transistors Tr101 and Tr102 are p-channel MOS transistors. A word line WL101 is connected to respective gates of the access transistor Tr101 and Tr102. Also provided is a driver transistor Tr103 of which drain is connected to the drain of the access transistor Tr101 and of which gate is connected to the drain of the access transistor Tr102. Further provided is a driver transistor Tr104 of which drain is connected to the drain of the access transistor Tr102 and of which gate is connected to the drain of the access transistor Tr101. The driver transistor Tr103 and Tr104 are n-channel MOS transistor. The sources of the driver transistor Tr103 and Tr104 are grounded.

FIG. 2A is schematic view showing a relationship between a gate electrode and a diffused layer in each transistor of the conventional SRAM cell and the contact plugs connected thereto. FIG. 2B is a schematic view showing a relationship between a first metal interconnect layer of the conventional SRAM cell and the contact plugs connected therebeneath. FIG. 3 is a sectional view along line C—C in FIGS. 2A and 2B.

In the conventional SRAM cell, as shown in FIG. 2A, the access transistors Tr101 and Tr102 are disposed side by side in the short direction at one end part in the longitudinal direction. The driver transistors Tr103 and Tr104 are disposed in this order over the end part on the side opposite to the side of the access transistors Tr101 and Tr102 in the longitudinal direction.

This conventional SRAM cell is provided with a gate poly-silicon layer G101 constituting the gate electrodes of the access transistor Tr101 and Tr102. The gate poly-silicon layer G101 is extended in the short direction of the cell. The gate poly-silicon layer G101 is shared among a plurality of SRAM cells arrayed in the short direction and constitutes the word line WL101 of these SRAM cells. Further, gate poly-silicon layers G103 and G104 are provided to constitute the gate electrodes of the driver transistors Tr103 and Tr104, respectively.

In addition, a contact plug CS101 is provided on a source diffused layer S101 of the access transistor Tr101 and a contact plug CD101 is provided on a drain diffused layer D101 of the access transistor Tr101. Similarly, a contact plug CS102 is provided on a source diffused layer S102 of the access transistor Tr102 and a contact plug CD102 is provided on a drain diffused layer D102 of the access transistor Tr102. A contact plug CS103 is provided on a source diffused layer S103 of the driver transistor Tr103 and a contact plug CD103 is provided on a drain diffused layer D103 of the driver transistor Tr103. Furthermore, a contact plug CS104 is provided on a source diffused layer S104 of the driver transistor Tr104 and a contact plug CD104 is provided on a drain diffused layer D104 of the driver transistor Tr104.

The gate poly-silicon layer G103 is connected to the drain diffused layer D102 of the access transistor Tr102 via the contact plug CD102 and connected to the drain diffused layer D104 of the driver transistor Tr104 via the contact plug CD104. The gate poly-silicon layer G104 is connected to the drain diffused layer D101 of the access transistor Tr101 via the contact plug CD101 and connected to the drain diffused layer D103 of the driver transistor Tr103 via the contact plug CD103.

As shown in FIG. 3, a sidewall insulating layer 102 is formed on the side of each gate poly-silicon layer except for portions with which the contact plugs are in contact. A gate oxide film 105 is formed between each gate poly-silicon layer and the p-type semiconductor substrate 101. An n-well 104 is formed at the surface of a semiconductor substrate 101 in a region in which the access transistors Tr101 and Tr102 are provided. Further, an embedded field insulating layer 103 is selectively formed between the transistors. First and second interlayer insulating layers 151 and 152 for coating the entire surface of these gate poly-silicon layers, diffused layers and the like are formed in this order. The contact plugs CD101, CD102, CD103 and CD104 provided on the drain diffused layer of each transistor are formed only in the first interlayer insulating layer 151.

Furthermore, as shown in FIGS. 2B and 3, a first metal interconnect layer 161 is provided on the second interlayer insulating layer 152. A ground layer 112 connected to the contact plugs CS103 and CS104 is formed in the first metal interconnect layer 161. Interconnect layers 113a and 113b connected to the contact plug CS101 and CS102, respectively, are also formed in the first metal interconnect layer 161.

Furthermore, a third interlayer insulating layer 153 is formed on the second interlayer insulating layer 152 and first metal interconnect layer 161. Through holes are formed at positions coinciding with the interconnect layers 113a or 113b in the third interlayer insulating layer 153 and conductive layers 114 are embedded in the through holes. Further, as shown in FIG. 3, a second metal interconnect layer 162 is provided on the third interlayer insulating layer 153. Two bit lines BL101 and BL102 connected to each conductive layer 114 are formed in the second metal interconnect layer 162. The bit lines BL101 and BL102 are extended in the longitudinal direction of the cell and are shared among a plurality of SRAM cells disposed along the direction.

The threshold voltage of the driver transistors Tr103 and Tr104 is set higher than that of the access transistors Tr101 and Tr102 by, for example, about 0.1–0.6 V.

In the conventional SRAM cell constituted as described above, an SRAM cell can be constituted by four transistors since the threshold value of each transistor is appropriately prescribed. As a result, the occupied area can be substantially reduced compared with the one using six transistors.

In the above-described conventional SRAM cell constituted by four transistors, however, the expected object is achieved, but saving the area is not enough to respond to the recent further circuit integration. In addition, there is a problem that the recent increase of operation speed cannot be sufficiently responded.

Furthermore, there is also a problem that it is extremely difficult to control the shape of a diffused layer to the designed shape in actual manufacturing processes in the SRAM cells described in the aforementioned Japanese Patent Laid-Open Publication No. Hei 9-270468 and Japanese Patent Laid-Open Publication No. Hei 10-178110.

SUMMARY OF THE INVENTION

An object of the present invention is to provide a semiconductor storage device provided with four-transistor memory cells capable of reducing the occupied area and improving the operation speed.

A semiconductor storage device according to the present invention comprises two bit lines, a first transistor of a first conductive type, a second transistor of the first conductive type, a third transistor of a second conductive type and a fourth transistor of the second conductive type. Sources of the first and second transistors are connected to the two bit lines, respectively. The first and second transistors are disposed in a channel width direction thereof and in the longitudinal direction of the four-transistor memory cell on a semiconductor substrate. A drain of the third transistor is connected to a drain of the first transistor, a gate of the third transistor is connected to a drain of the second transistor and a source of the third transistor is grounded. A drain of the fourth transistor is connected to the drain of the second transistor, a gate of the fourth transistor is connected to the drain of the first transistor and a source of the fourth transistor is grounded.

According to the present invention, in the semiconductor storage device having four-transistor memory cells, the first and second transistors connected to the bit line pair are disposed in the direction of the channel width thereof and in the longitudinal direction of the four-transistor memory cells on the semiconductor substrate. Therefore, it is possible to extend a source/drain diffused layers of each transistor in the short direction to reduce the occupied area. Consequently, a word line can be extended in the longitudinal direction while bit lines can be extended in the short direction. As a result, high-speed operation can be achieved due to reduction of the bit line capacitance.

If a word line composed of a metal layer is provided, resistance and capacitance of the word line are reduced and thereby further high-speed operation can be achieved.

In addition, if bit lines are disposed to extend in the short direction, the bit line length is substantially shortened and thereby further high-speed operation can be achieved.

The nature, principle, and utility of the invention will become more apparent from the following detailed description when read in conjunction with the accompanying drawings in which like parts are designated by like reference numerals or characters.

DETAILED DESCRIPTION OF THE PREFERRED EMBODIMENT

Figure 4:
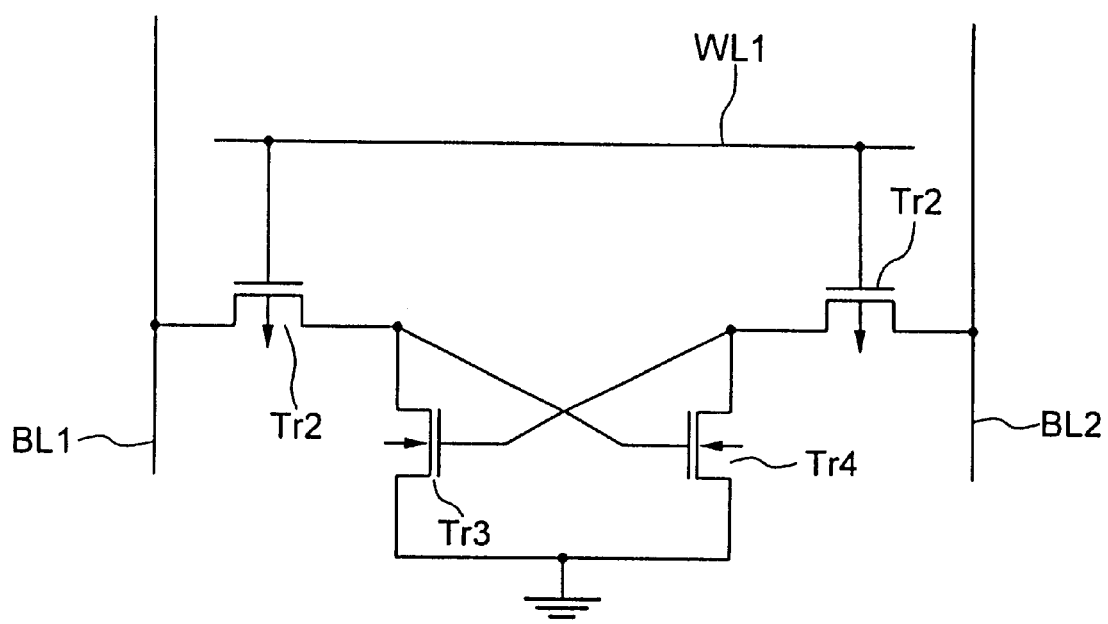
FIG. 4 is a circuit diagram showing one memory cell of a semiconductor storage device according to a first embodiment of the present invention.

The embodiments of the present invention will be described in detail below with reference to accompanying drawings. FIG. 4 is a circuit diagram showing one memory cell of a semiconductor storage device according to a first embodiment of the present invention.

The first embodiment is an SRAM device provided with four-transistor memory cells wherein a plurality of memory cells in a matrix are provided on a semiconductor substrate. Access transistors Tr1 and Tr21 of which sources are connected to two bit lines BL1 and BL2 constituting a bit line pair are provided in a memory cell as shown in FIG. 4. The access transistors Tr1 and Tr2 are, for example, p-channel MOS transistors. A word line WL1 is connected to the respective gates of the access transistors Tr1 and Tr2.

Also provided is a driver transistor Tr3 of which drain is connected to the drain of the access transistor Tr1 and of which gate is connected to the drain of the access transistor Tr2. Further provided is a driver transistor Tr4 of which drain is connected to the drain of the access transistor Tr2 and of which gate is connected to the drain of the access transistor Tr1. The driver transistors Tr3 and Tr4 are, for example, n-channel MOS transistors. The sources of the driver transistors Tr3 and Tr4 are grounded.

Figure 5:
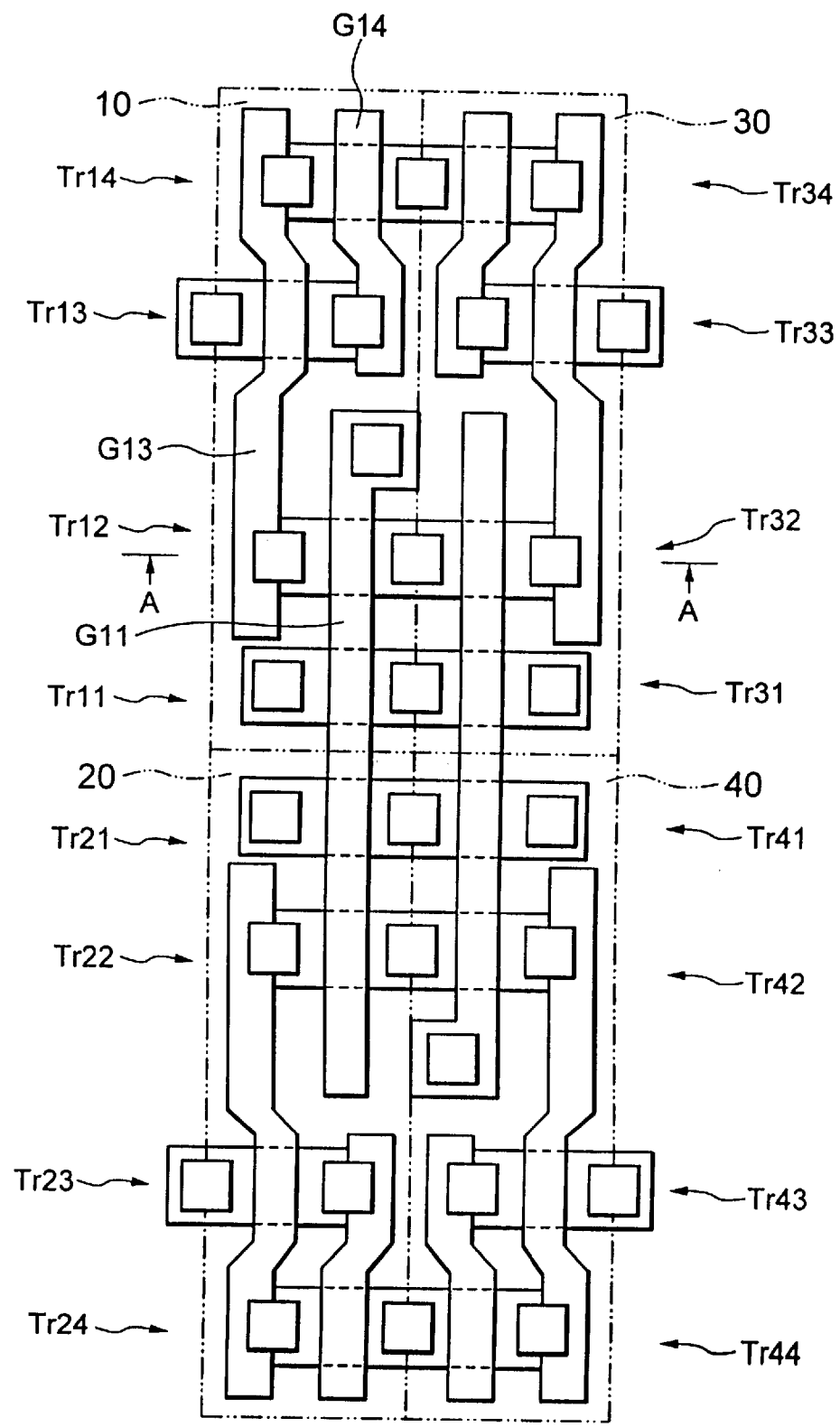
FIG. 5 is a schematic view showing a relationship between a gate electrode and a diffused layer of each transistor and contact plugs connected thereto in the first embodiment.
Figure 6:
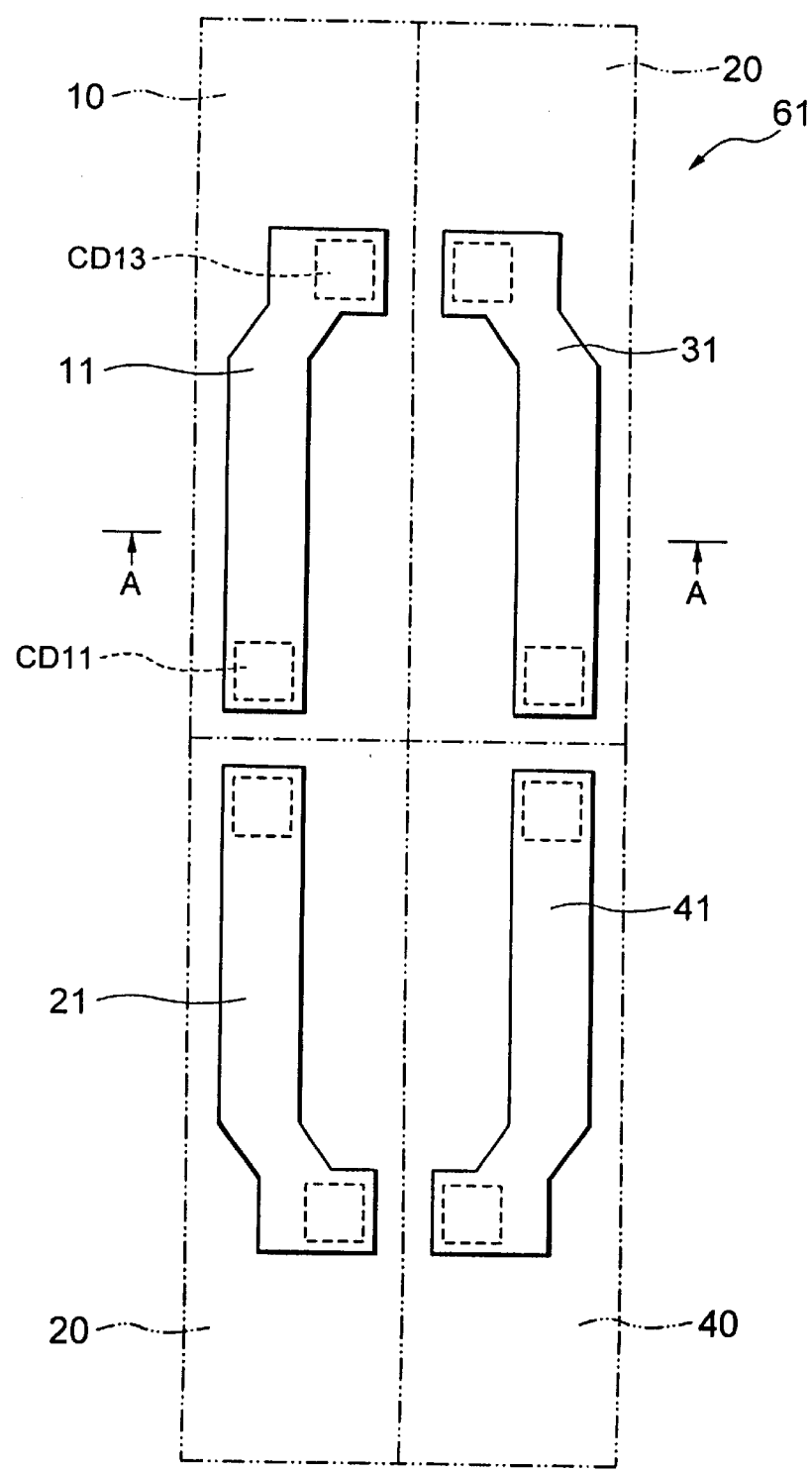
FIG. 6 is a schematic view showing a relationship between a first metal interconnect layer and contact plugs connected therebeneath in the first embodiment.
Figure 7:
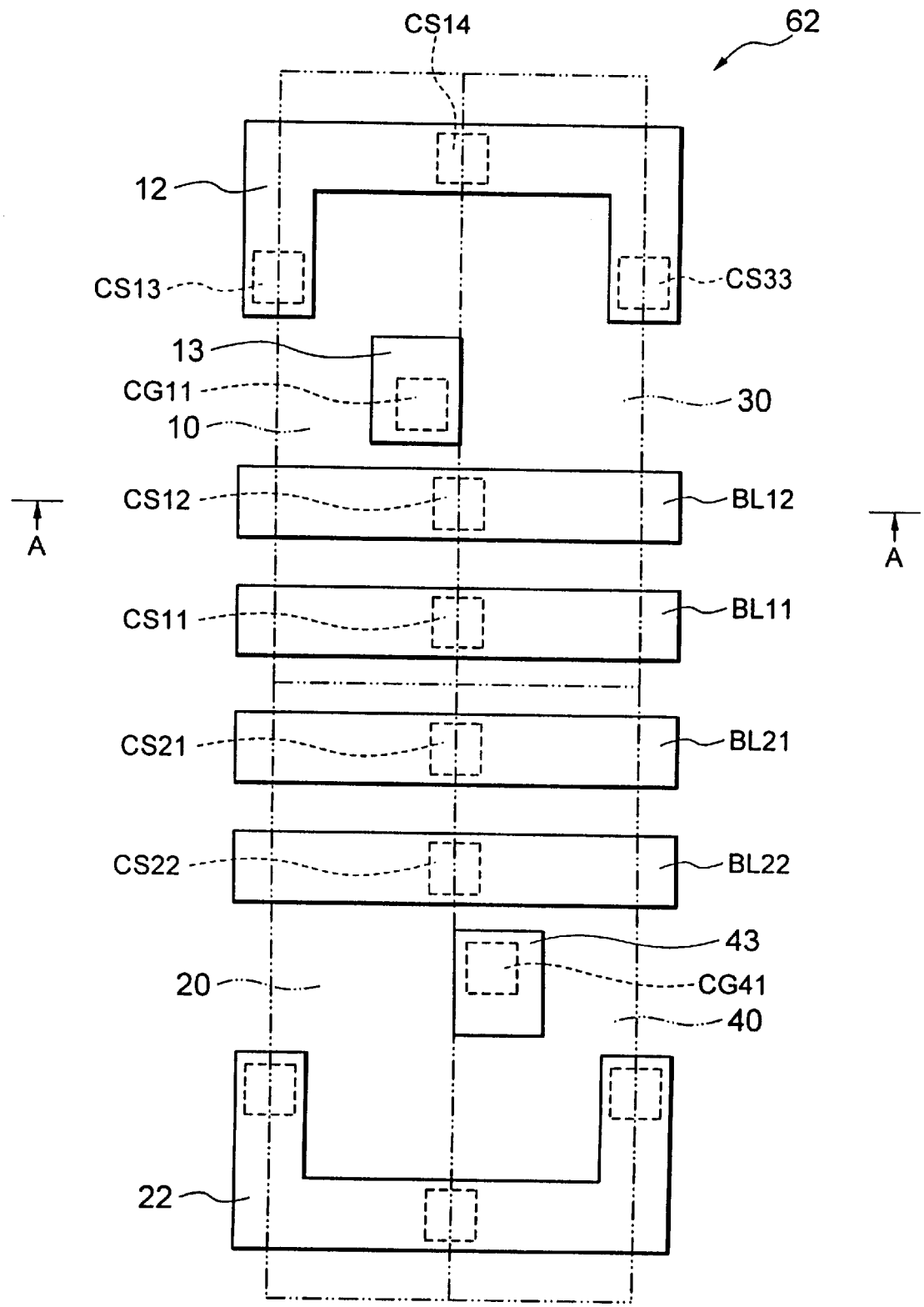
FIG. 7 is a schematic view showing a relationship between a second metal interconnect layer and contact plugs connected therebeneath in first embodiment.
Figure 8:
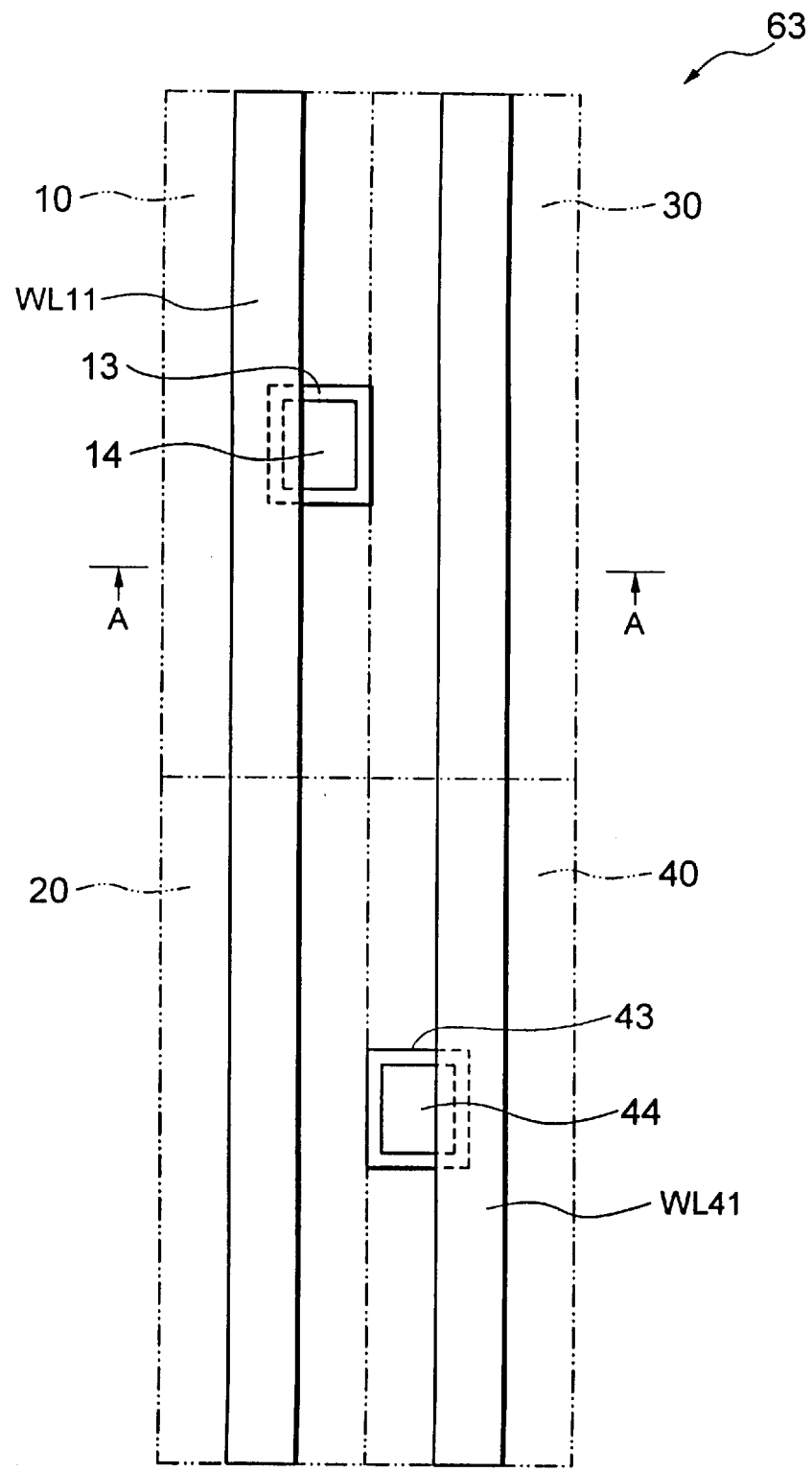
FIG. 8 is a schematic view showing a relationship between a third metal interconnect layer and contact plugs connected therebeneath in the first embodiment.
Figure 9:
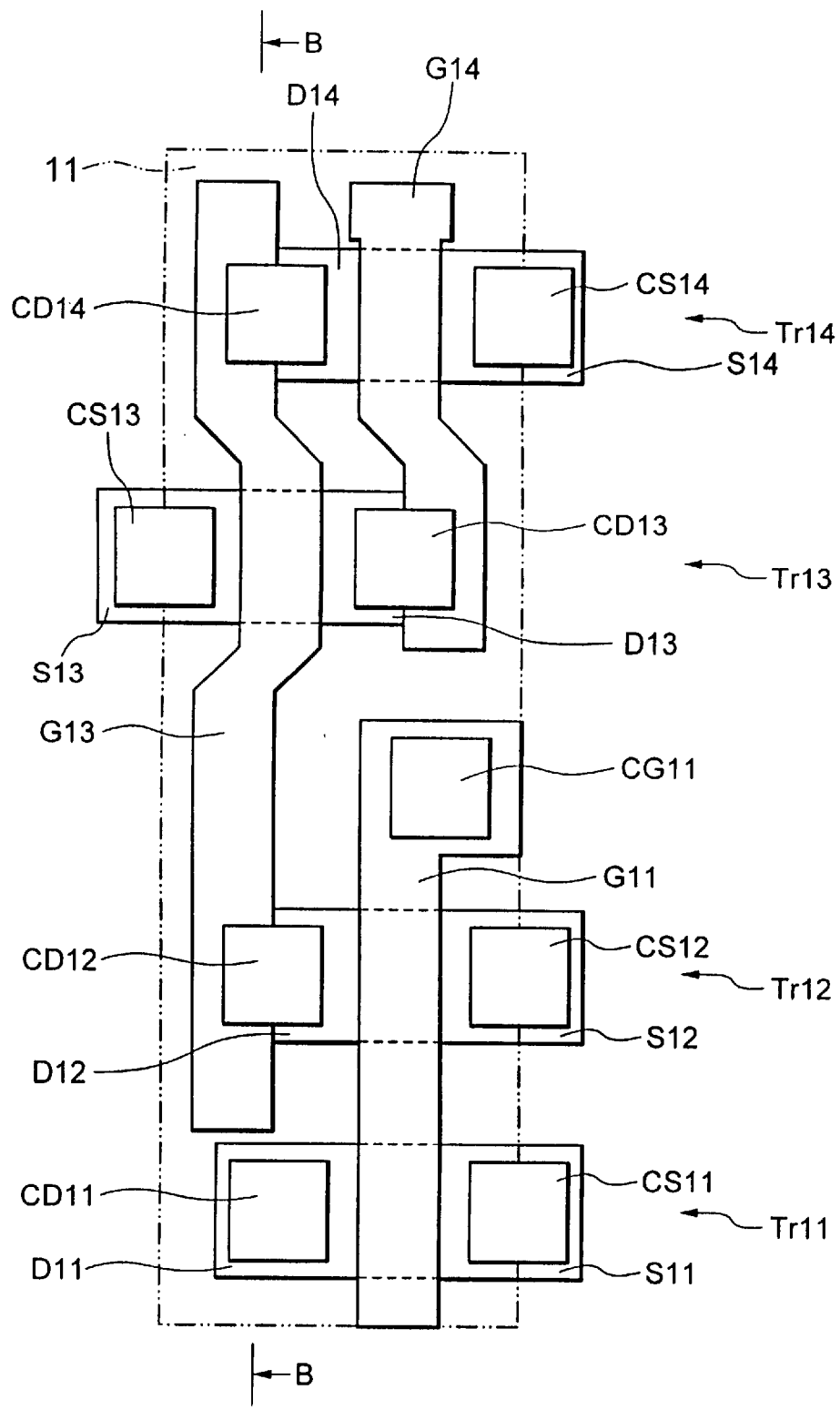
FIG. 9 is a schematic view showing an enlarged first memory cell in FIG. 5.
Figure 10:
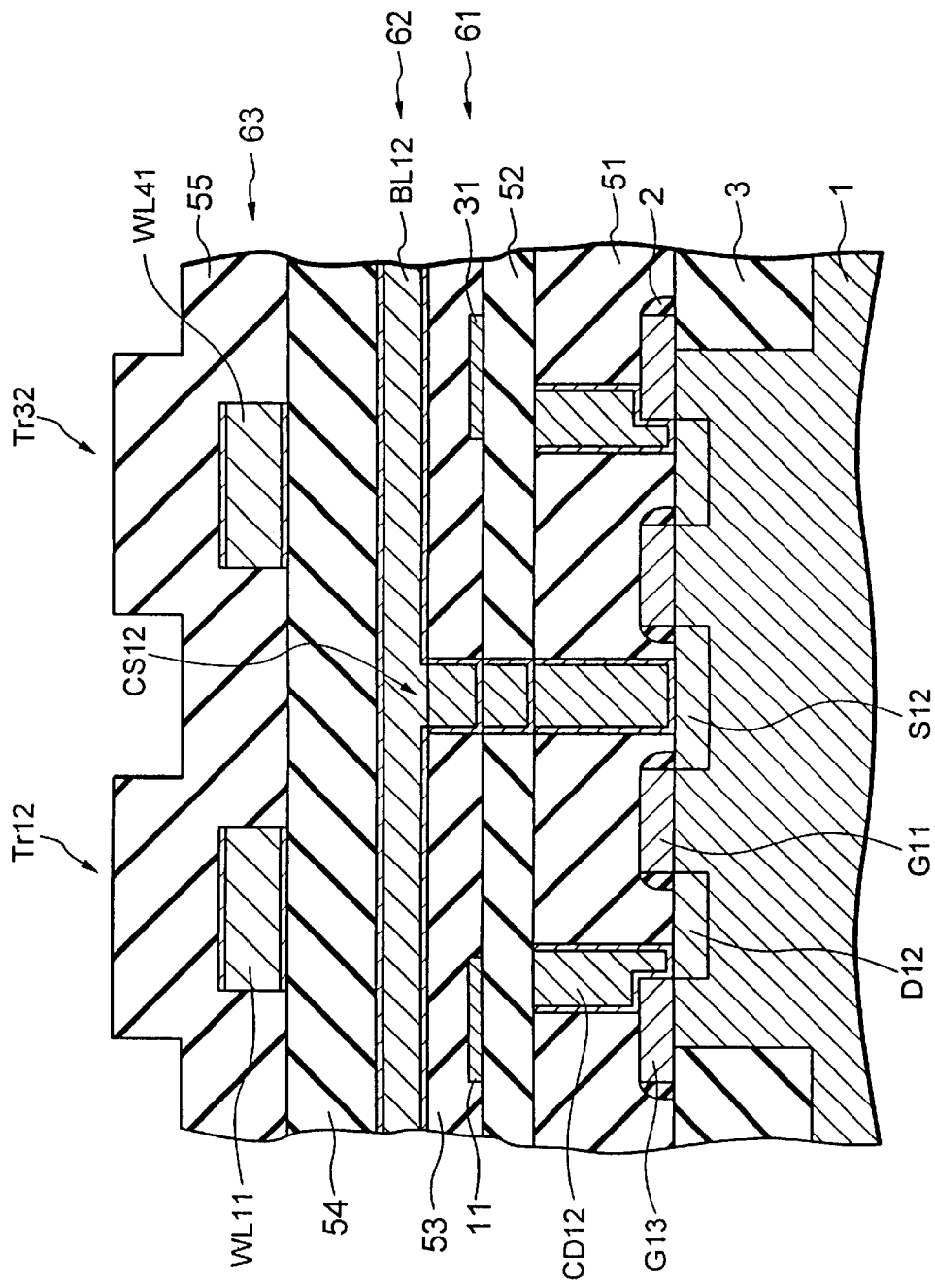
FIG. 10 is a sectional view taken along line A—A in FIGS. 5 to 8.
Figure 11:
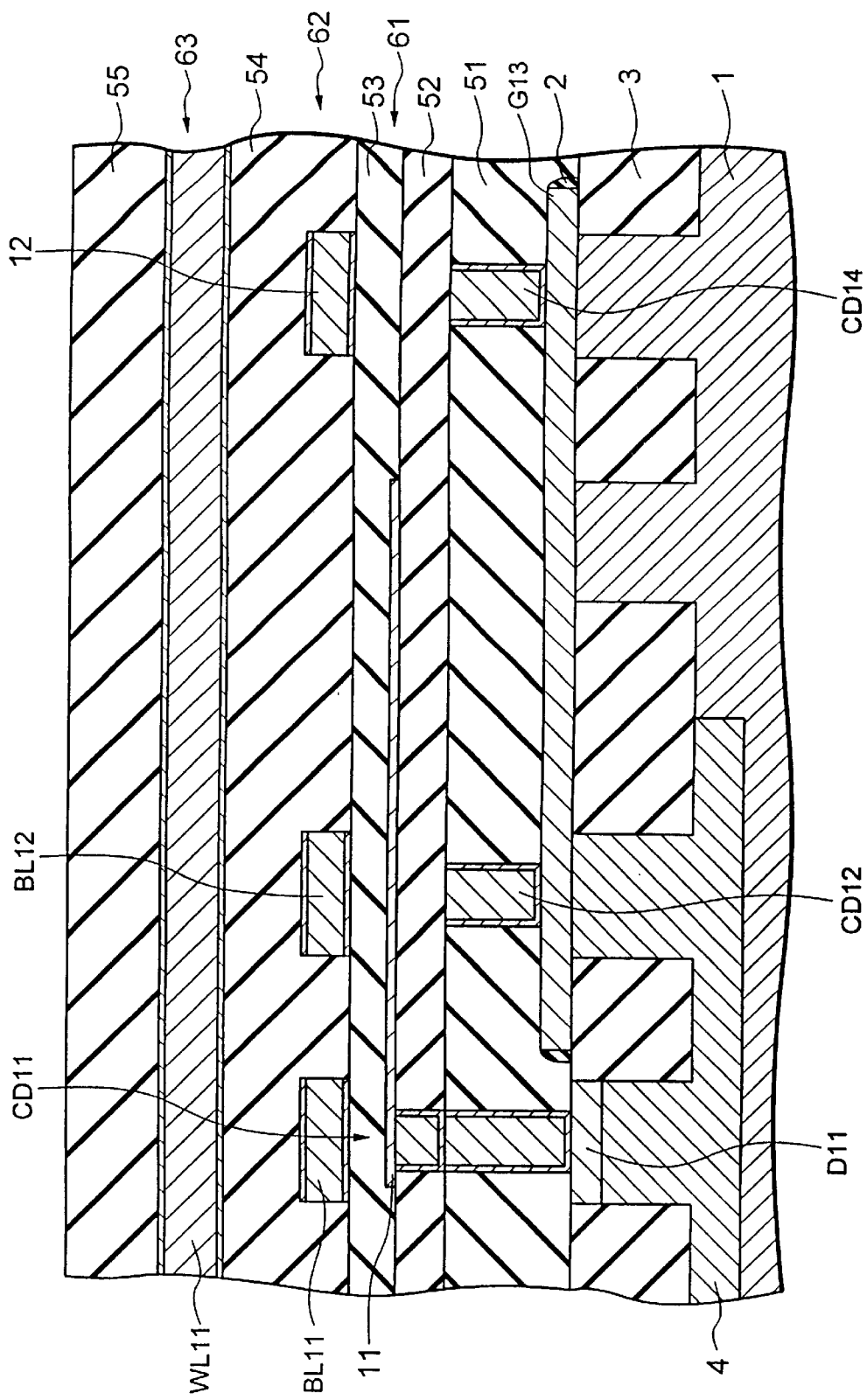
FIG. 11 is a sectional view taken along line B—B in FIG. 9.

The layout of the memory cells constituted as described above will be described below. FIG. 5 is a schematic view showing a relationship between a gate electrode and a diffused layer of each transistor and contact plugs connected thereto in the first embodiment. FIG. 6 is a schematic view showing a relationship between a first metal interconnect layer and contact plugs connected therebeneath in the first embodiment. FIG. 7 is a schematic view showing a relationship between a second metal interconnect layer and contact plugs connected therebeneath in first embodiment. FIG. 8 is a schematic view showing a relationship between a third metal interconnect layer and contact plugs connected therebeneath in the first embodiment. FIG. 9 is a schematic view showing an enlarged first memory cell in FIG. 5. FIG. 10 is a sectional view taken along line A—A in FIGS. 5 to 8. FIG. 11 is a sectional view taken along line B—B in FIG. 9.

FIGS. 5 to 8 show first to fourth memory cells 10, 20, 30 and 40. As shown in FIGS. 5 to 8, the first memory cell 10 and the second memory cell 20 are disposed adjacent to each other in the longitudinal direction of the cells while the third memory cell 30 and the fourth memory cell 40 are disposed adjacent to each other in the longitudinal direction of the cells. The first memory cell 10 and the third memory cell 30 are disposed adjacent to each other in the direction perpendicular to the longitudinal direction, that is, in the short direction while the second memory cell 20 and the fourth memory cell 40 are disposed adjacent to each other in the short direction.

In the first memory cell 10, an access transistor Tr11, an access transistor Tr12, a driver transistor Tr13 and a driver transistor Tr14 are disposed in this order along the longitudinal direction as shown in FIG. 9. The access transistor Tr11 is equivalent to the access transistor Tr1 in FIG. 4. The access transistor Tr12 is equivalent to the access transistor Tr2 in FIG. 4. The driver transistor Tr13 is equivalent to the driver transistor Tr3 in FIG. 4. The driver transistor Tr14 is equivalent to the driver transistor Tr4 in FIG. 4.

The source/drain diffused layers of these transistors Tr11 to Tr14 are extended in the short direction of the cell and the width thereof is constant. That is, no bend exists in any of the diffused layers. Source diffused layers S11, S12 and S14 of the access transistors Tr11 and Tr12 and the driver transistor Tr14 are shared with the neighboring third memory cell 30. Source diffused layer S13 of the driver transistor Tr13 is shared with a memory cell (not shown) adjacent to the third memory cell 30 on the other side.

A gate poly-silicon layer G11 is provided to constitute gate electrodes of the access transistors Tr11 and Tr12. The gate poly-silicon layer G11 is extended in the longitudinal direction of the cell. The gate poly-silicon layer G11 is shared with the second memory cell 20 neighboring in the longitudinal direction of the cell. Further, gate poly-silicon layers G13 and G14 are provided to constitute gate electrodes of the driver transistors Tr13 and Tr14. The gate poly-silicon layers G13 and G14 are bent to the third memory cell 30 side at a position coinciding with the driver transistor Tr13, but are substantially extended in the longitudinal direction of the cell.

In addition, a contact plug CS11 is provided on the source diffused layer S11 and a contact plug CD11 is provided on the drain diffused layer D11 in the access transistor Tr11. Similarly, a contact plug CS12 is provided on the source diffused layer S12 and a contact plug CD12 is provided on the drain diffused layer D12 in the access transistor Tr12. A contact plug CS13 is provided on the source diffused layer S13 and a contact plug CD13 is provided on the drain diffused layer D13 in the driver transistor Tr13. A contact plug CS14 is provided on the source diffused layer S14 and a contact plug CD14 is provided on the drain diffused layer D14 in the driver transistor Tr14. Furthermore, a contact plug CG11 is provided on the end part of the gate poly-silicon layer G11.

The gate poly-silicon layer G13 is connected to the drain diffused layer D12 of the access transistor Tr12 via the contact plug CD12 and connected to the drain diffused layer D14 of the driver transistor Tr14 via the contact plug CD14. The gate poly-silicon layer G14 is connected to the drain diffused layer D13 of the driver transistor Tr13 via the contact plug CD13.

The second memory cell 20 is disposed so as to be symmetric with reference to the borderline with the first memory cell 10. That is, an access transistor Tr21, an access transistor Tr22, a driver transistor Tr23 and a driver transistor Tr24 are disposed along the longitudinal direction in the order reverse to that of the first memory cell 10. Therefore, the access transistor Tr21 is disposed at the position closest to the access transistor Tr11. The access transistor Tr21 is equivalent to the access transistor Tr1 in FIG. 4. The access transistor Tr22 is equivalent to the access transistor Tr2 in FIG. 4. The driver transistor Tr23 is equivalent to the driver transistor Tr3 in FIG. 4. The driver transistor Tr24 is equivalent to the driver transistor Tr4 in FIG. 4. In the second memory cell 20, however, no contact plugs for constituting gate electrodes of two access transistor are provided on the gate poly-silicon layer G11.

The third memory cell 30 is disposed so as to be symmetric with reference to the borderline with the first memory cell 10. That is, an access transistor Tr31, an access transistor Tr32, a driver transistor Tr33 and a driver transistor Tr34 are disposed along the longitudinal direction in the same order as that of the first memory cell 10. The access transistor Tr31 is equivalent to the access transistor Tr1 in FIG. 4. The access transistor Tr32 is equivalent to the access transistor Tr2 in FIG. 4. The driver transistor Tr33 is equivalent to the driver transistor Tr3 in FIG. 4. The driver transistor Tr34 is equivalent to the driver transistor Tr4 in FIG. 4. In the third memory cell 30, however, no contact plugs for constituting gate electrodes of 2 access transistor are provided on the gate-poly-silicon layer.

The fourth memory cell 40 is disposed so as to be symmetric with reference to the boundary point with the first memory cell 10. That is, an access transistor Tr41, an access transistor Tr42, a driver transistor Tr43 and a driver transistor Tr44 are disposed along the longitudinal direction in the same order as that of the first memory cell 20. The access transistor Tr41 is equivalent to the access transistor Tr1 in FIG. 4. The access transistor Tr42 is equivalent to the access transistor Tr2 in FIG. 4. The driver transistor Tr43 is equivalent to the driver transistor Tr3 in FIG. 4. The driver transistor Tr44 is equivalent to the driver transistor Tr4 in FIG. 4.

As shown in FIGS. 10 and 11, a sidewall insulating layer 2 is formed on the side surface of each gate poly-silicon layer except for portions with which a contact plug is in contact with. A gate oxide film (not shown) is formed between each gate poly-silicon layer and a p-type semiconductor substrate 1. An n-well 4 is formed at the surface of the semiconductor substrate 1 in a region where the access transistors Tr11 and Tr12 are formed. Furthermore, an embedded-type field insulating layer 3 is selectively formed between the transistors. First and second interlayer insulating layers 51 and 52 for coating the entire surface of these gate poly-silicon layers, diffused layers and the like are formed in this order upward. The contact plugs for connecting the gate poly-silicon layer and the drain diffused layer of two transistors, for example, the contact plugs CD12 and CD14 in the first memory cell 10 are formed only in the first interlayer insulating layer 51.

In this embodiment, a first metal interconnect layer 61 is provided on the second interlayer insulating layer 52 as shown in FIGS. 6, 10 and 11. Interconnect lines 11 connected to the contact plugs CD11 and CD13 are formed in the first metal interconnect layer 61 in the first memory cell 10. Similar interconnect lines 21, 31 and 41 are formed in the second to fourth memory cells 20, 30 and 40 as well, respectively. Furthermore, a third interlayer insulating layer 53 is formed on the second interlayer insulating layer 52 and the first metal interconnect layer 61.

The first metal interconnect layer 61 is made of, but is not limited to, for example, TiN.

As shown in FIGS. 7, 10 and 11, a second metal interconnect layer 62 is provided on the third interlayer insulating layer 53. A ground interconnect lines 12 connected to contact plugs connected to a source diffused layer of a driver transistor, for example, the contact plugs CS13 and CS14 in the first memory cell 10 are formed in the second metal interconnect layer 62. The ground interconnect line 12 is also connected to the contact plug CS33 connected to the source diffused layer of the driver transistor Tr33 in the third memory cell 30. Similarly, a ground interconnect line 22 is formed in the second and fourth memory cell 20 and 40.

In addition, two bit lines BL11 and BL12 connected to the second contact plugs CS11 and CS12, respectively, are formed in the metal interconnect layer 62 in the first memory cell 10. The bit lines BL11 and BL12 constitute a bit line pair in the SRAM. The bit lines BL11 and BL12 are extended in the short direction of the cell and are shared among a plurality of memory cells disposed side by side in this direction, such as the third memory cell 30. Similarly, two bit lines BL21 and BL22 connected to the contact plugs CS21 and CS22, respectively, are formed in the second metal interconnect layer 62 in the second memory cell 20. The bit lines BL21 and BL22 are extended in the short direction of the cell and are shared among a plurality of memory cells disposed side by side in this direction, such as the fourth memory cell 40. The contact plugs CS21 and CS22 are connected to the source diffused layers of the access transistors Tr21 and Tr22, respectively.

Furthermore, an interconnect line 13 connected to a contact plug connected to a gate poly-silicon layer, for example, the contact plug CG11 in the first memory cell 10 is formed in the second metal interconnect layer 62 to constitute a gate electrode of the access transistor. Similarly, an interconnect line 43 connected to a contact plug CG41 is formed in the fourth memory cell 40 as well. The contact plug CG41 is connected to the gate poly-silicon layer constituting gate electrodes of the access transistors Tr41 and Tr42.

The second metal interconnect layer 62 has, but is not limited to, a laminated structure constituted by, for example, TiN, AlCu, TiN and Ti deposited successively.

Furthermore, a fourth interlayer insulating layer 54 is formed on the third interlayer insulating layer 53 and the second metal interconnect layer 62 as shown in FIGS. 8, 10 and 11. A through hole is formed in the fourth interlayer insulating layer 54 at a position coinciding with the interconnect lines 13 and 43 and conductive layers 14 and 44 are embedded therein, respectively. A third metal interconnect layer 63 is provided on the fourth interlayer insulating layer 54. A word line WL11 connected to a conductive layer embedded in a through hole, for example, the conductive layer 14 in the first memory cell 10 is formed in the third metal interconnect layer 63. The word line WL11 is extended in the longitudinal direction of the cell and shared among a plurality of memory cells disposed side by side in this direction such as the second memory cell 20 and the like. Similarly, a word line WL41 is formed in the fourth memory cell 40. The word line WL41 is extended in the longitudinal direction of the cell and shared among a plurality of memory cells disposed side by side in this direction such as the third memory cell 30 and the like.

The third metal interconnect layer 63 has, but is not limited to, a laminated structure constituted by, for example, TiN, AlCu, TiN and Ti deposited successively.

Furthermore, a protection insulating layer 55 is formed on the fourth interlayer insulating layer 54 and the third metal interconnect layer 63.

As shown in FIGS. 10 and 11, a contact plug is composed of a plurality of conductive layers except for the ones provided in the first interlayer insulating layer 51. Barrier metal layers are appropriately provided on these conductive layers and interconnect layers as the above-described interconnect layer having a laminated structure.

Figure 1:
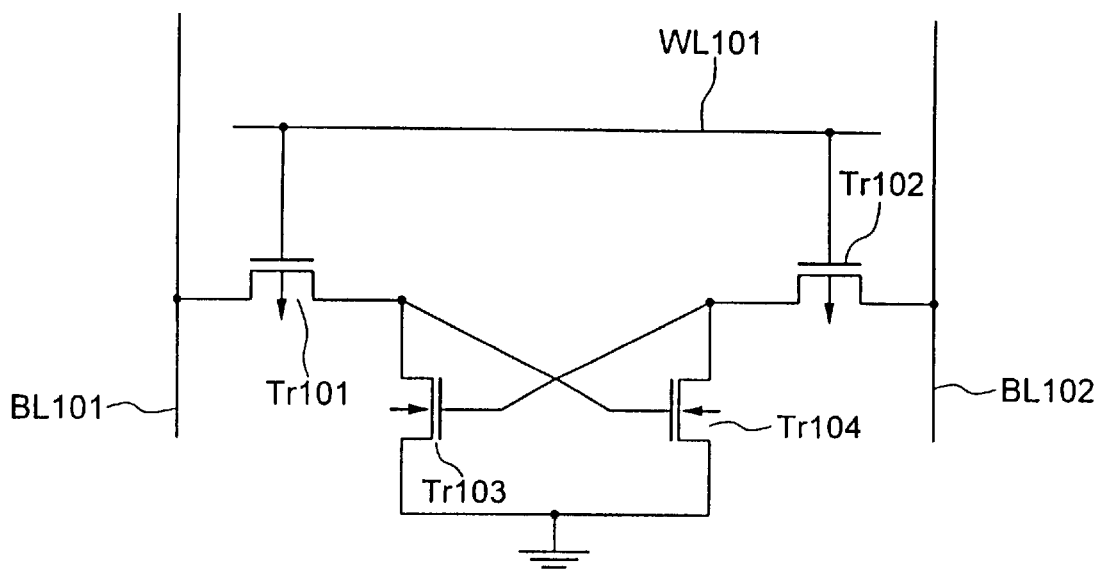
FIG. 1 is a circuit diagram showing a conventional SRAM cell.
Figure 2A:
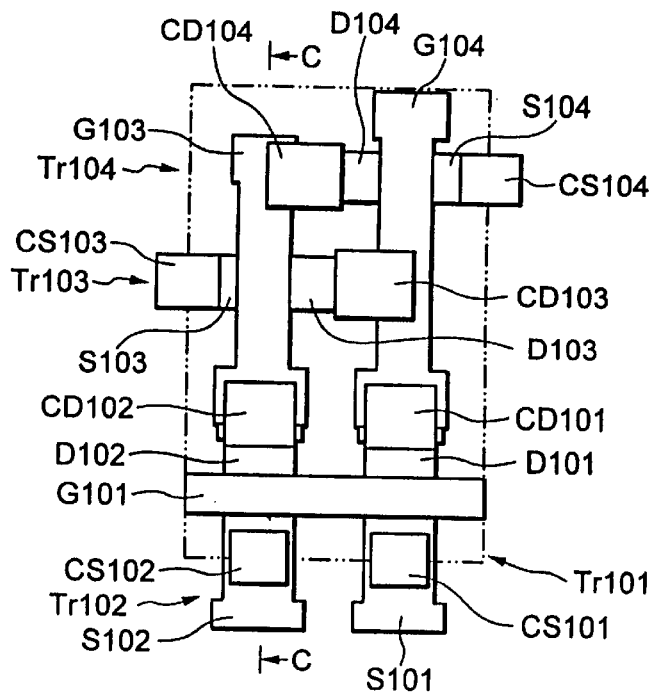
FIG. 2A is a schematic view showing a relationship between a gate electrode and a diffused layer of each transistor in the conventional SRAM cell and contact plugs.
Figure 2B:
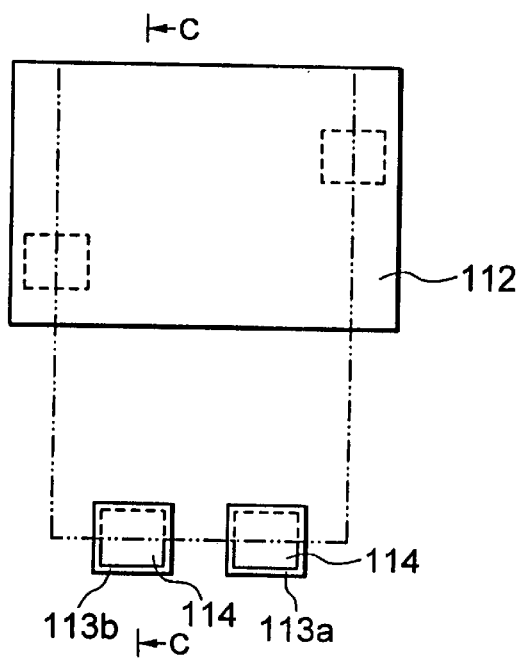
FIG. 2B is a schematic view showing a relationship between a first metal interconnect layer and contact plugs connected therebeneath in the conventional SRAM cell.
Figure 3:
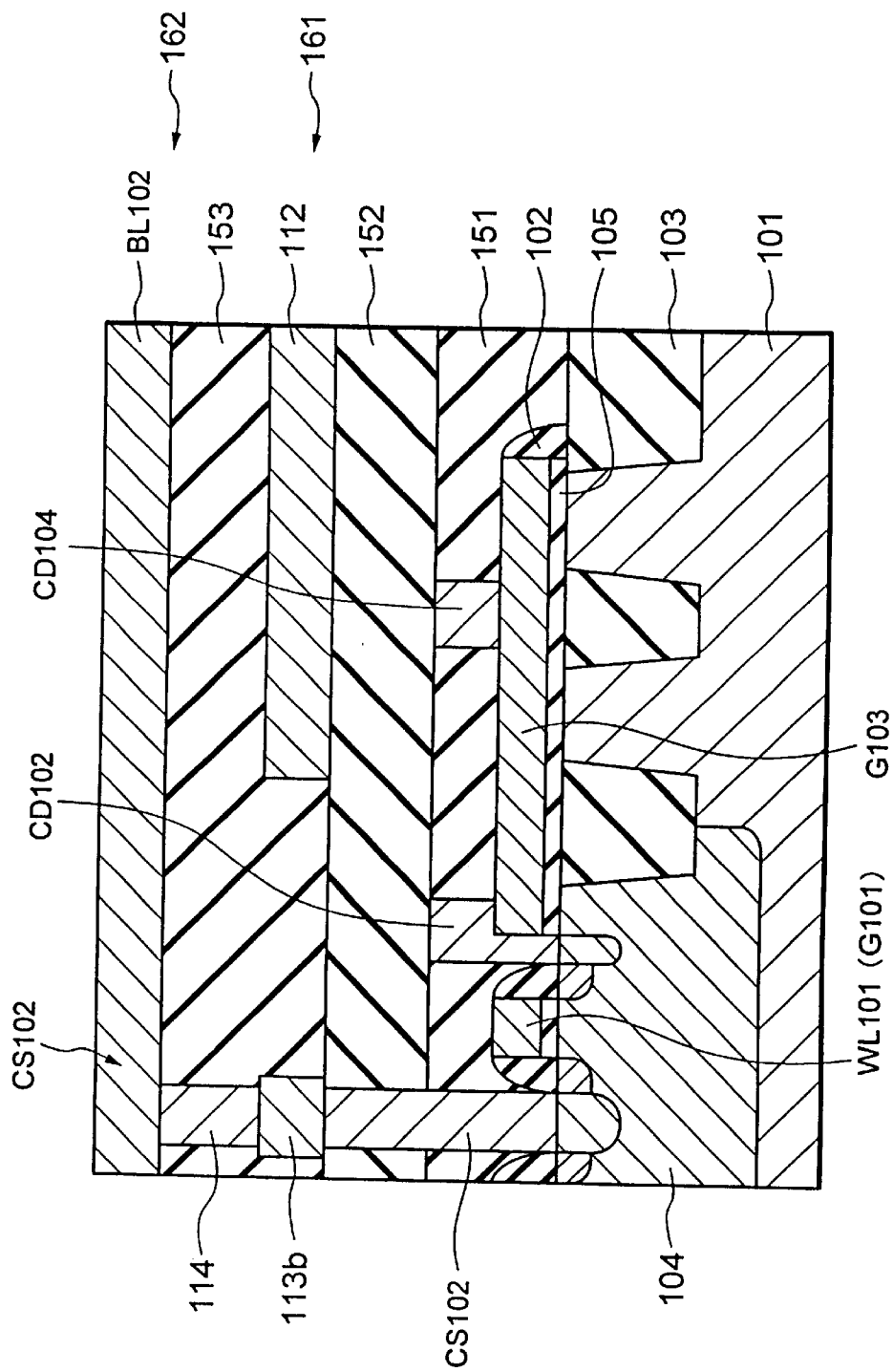
FIG. 3 is a sectional view taken along line C—C in FIGS. 2A and 2B.

In the first embodiment constituted as above, the occupied area can be reduced since two access transistors Tr11 and Tr12 in one memory cell are disposed in the longitudinal direction and no bend exists in each diffused layer. In comparison with the conventional ones shown in FIGS. 12A, 2B and 3, about 4 to 10% reduction is possible.

Figure 12A:
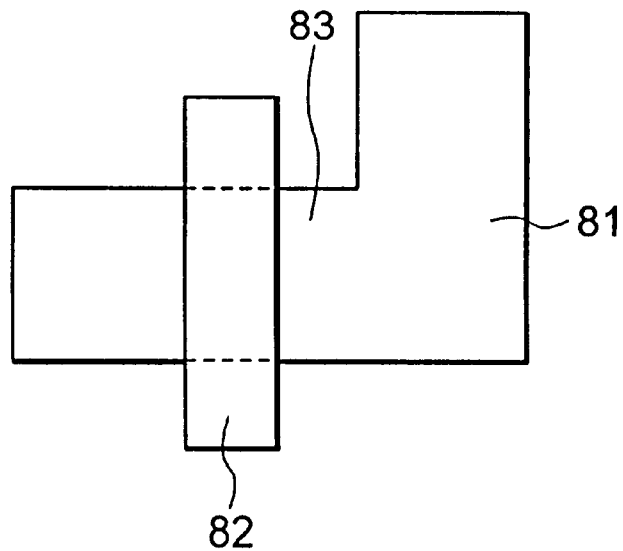
FIG. 12A is a schematic view showing a diffused layer having a bend on design.
Figure 12B:
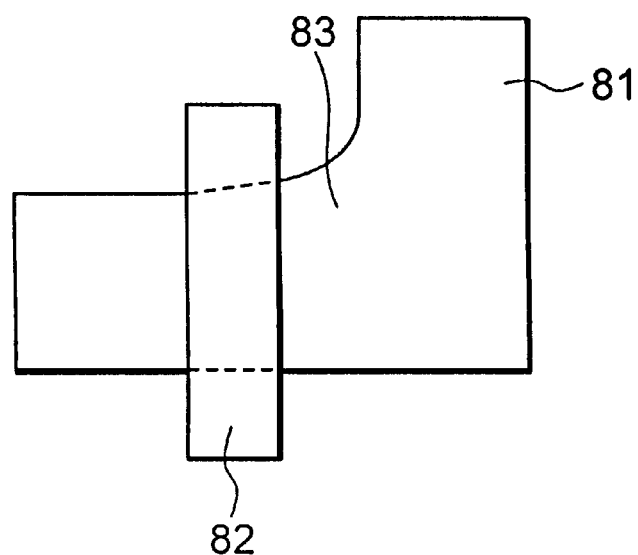
FIG. 12B is a schematic view showing the diffused layer after fabrication.

In addition, the gate poly-silicon layer constituting gate electrodes of four transistors is substantially extended in the longitudinal direction of the cell. All the lines connecting the source diffused layers and the drain diffused layers are extended in the short direction. No bend exists in any diffused layer. Therefore, control of the width and length is extremely easy on manufacturing processes. FIG. 12A is a schematic view showing a diffused layer having a bend on design. FIG. 12B is a schematic view showing a diffused layer after fabrication.

For example, if a gate electrode 82 is designed to be disposed on a diffused layer 81 provided with a bend 83 as shown in FIG. 12A, the diffused layer 81 is expanded inward at the bend 83 in the actual fabrication as shown in FIG. 12B. The overlapped part of the diffused layer 81 and the gate electrode 82 becomes larger than the designed one. As a result, the operation speed can be reduced from the designed value or the characteristics can be changed. In contrast, such a reduction of the operation speed can be prevented in this embodiment since no bend exists in any diffused layer as described above.

In addition, since word lines are extended in the longitudinal direction of the memory cell and the bit line pair is extended in the direction perpendicular to the longitudinal direction, that is, in the short direction in this embodiment, the bit line length is less than half of the conventional one in which the bit line pair is extended in the longitudinal direction. As a result, the bit line capacitance is reduced and thereby high-speed operation can be achieved.

Furthermore, the resistance and parasitic capacitance are reduced and thereby high-speed operation is enabled in this embodiment compared with the conventional one where word lines are all constituted by a polycrystalline silicon layer and shared among a multiplicity of memory cells arrayed in one direction since part of the gate poly-silicon layer is shared among four access transistors in two neighboring memory cells and connected to word lines formed in the third metal interconnect layer 63 provided in the upper layer. Since one contact plug is shared among four transistors as a contact plug for a gate poly-silicon layer of the access transistor, the increase in the area is extremely small.

Furthermore, since the ground interconnect line connected to the source diffused layer of the driver transistor has only the minimum area, capacitance between interconnect lines due to unnecessarily large ground layer is reduced and thereby high-speed operation is enabled.

The second embodiment of the present invention will be described below. In the second embodiment, contact plugs for a gate poly-silicon layer of the access transistor constituting a gate electrode are provided on a borderline of two memory cells.

Figure 13:
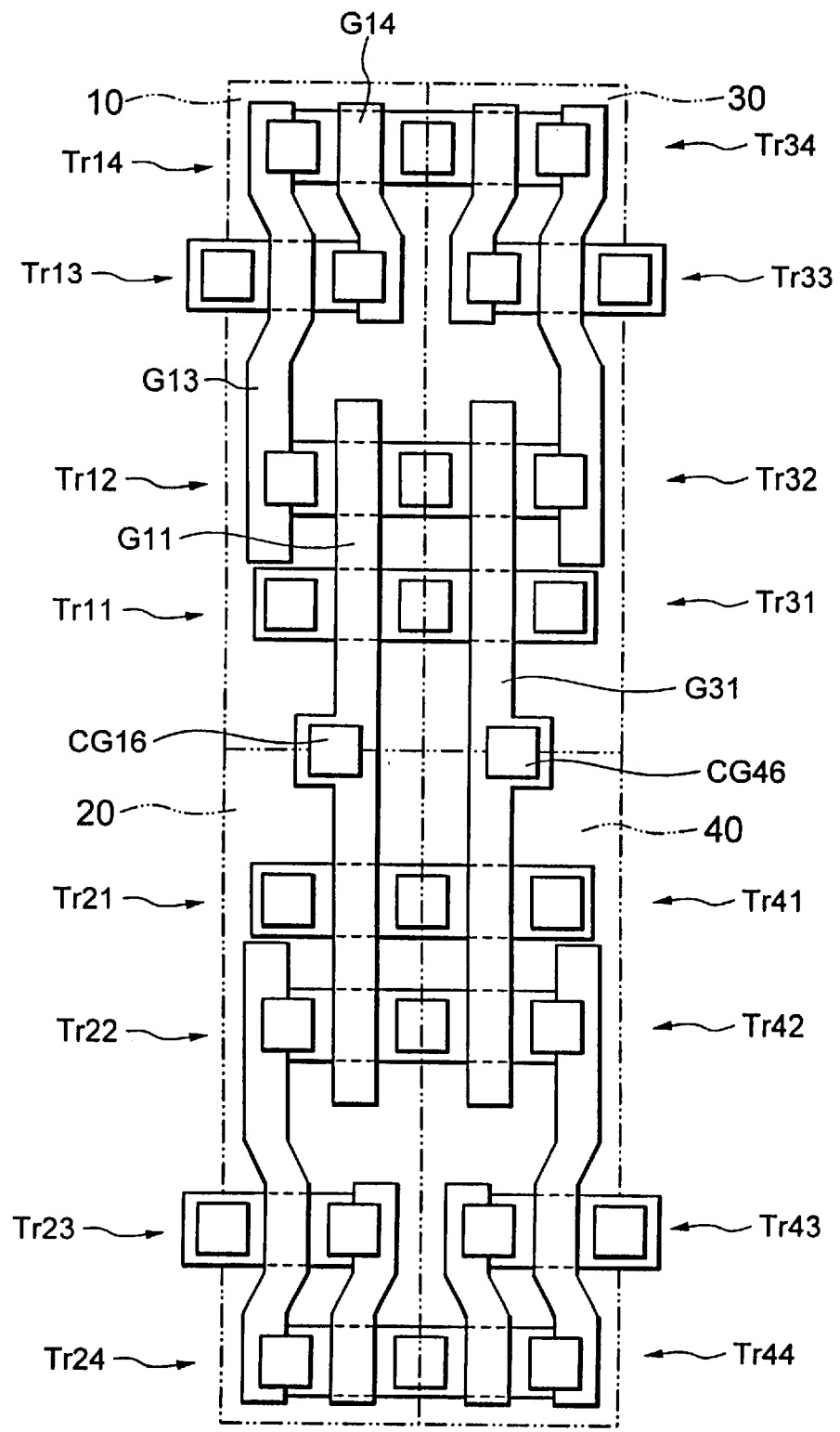
FIG. 13 is a schematic view showing a relationship between a gate electrode and a diffused layer of each transistor and contact plugs connected thereto in the second embodiment.
Figure 14:
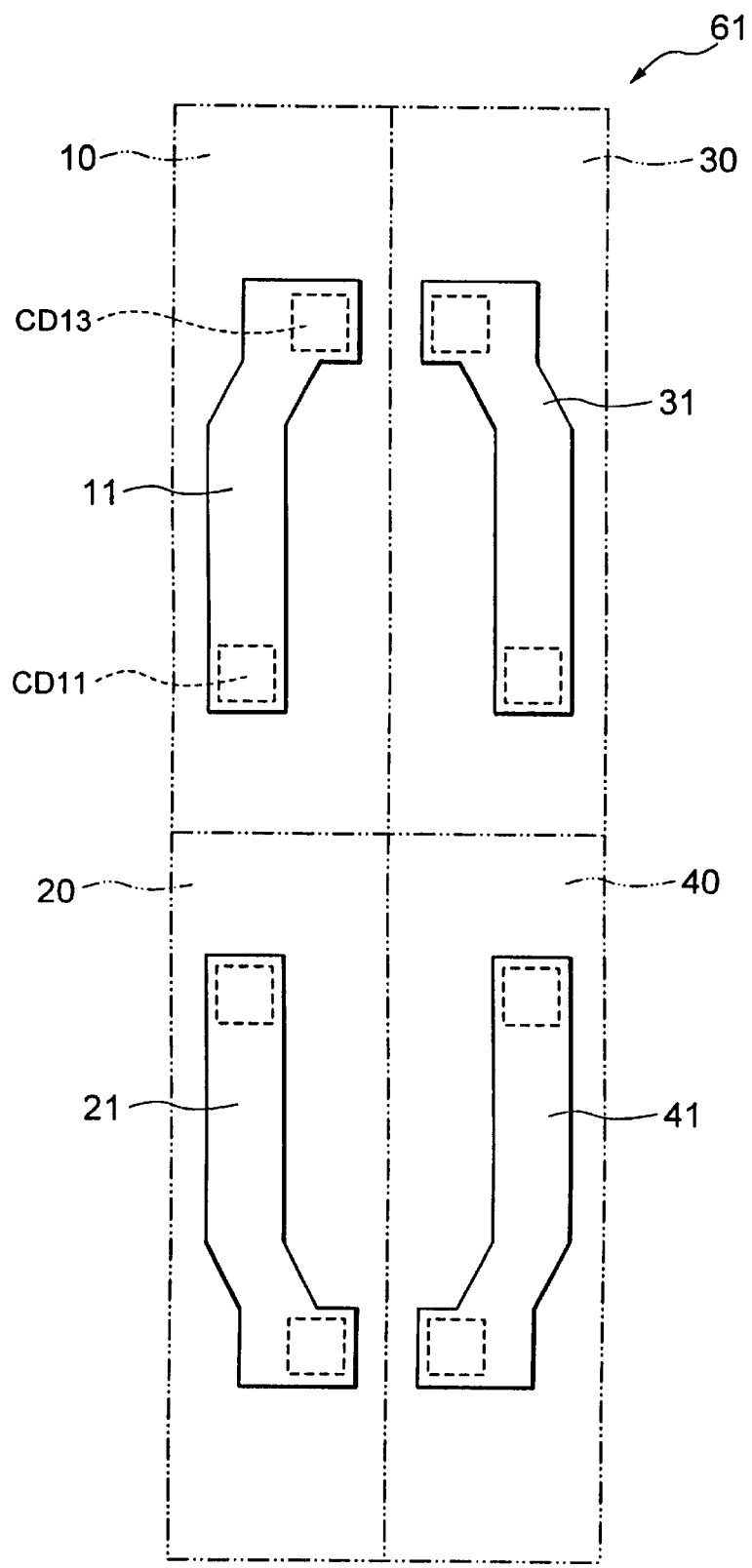
FIG. 14 is a schematic view showing a relationship between a first metal interconnect layer and contact plugs connected therebeneath in the second embodiment.
Figure 15:
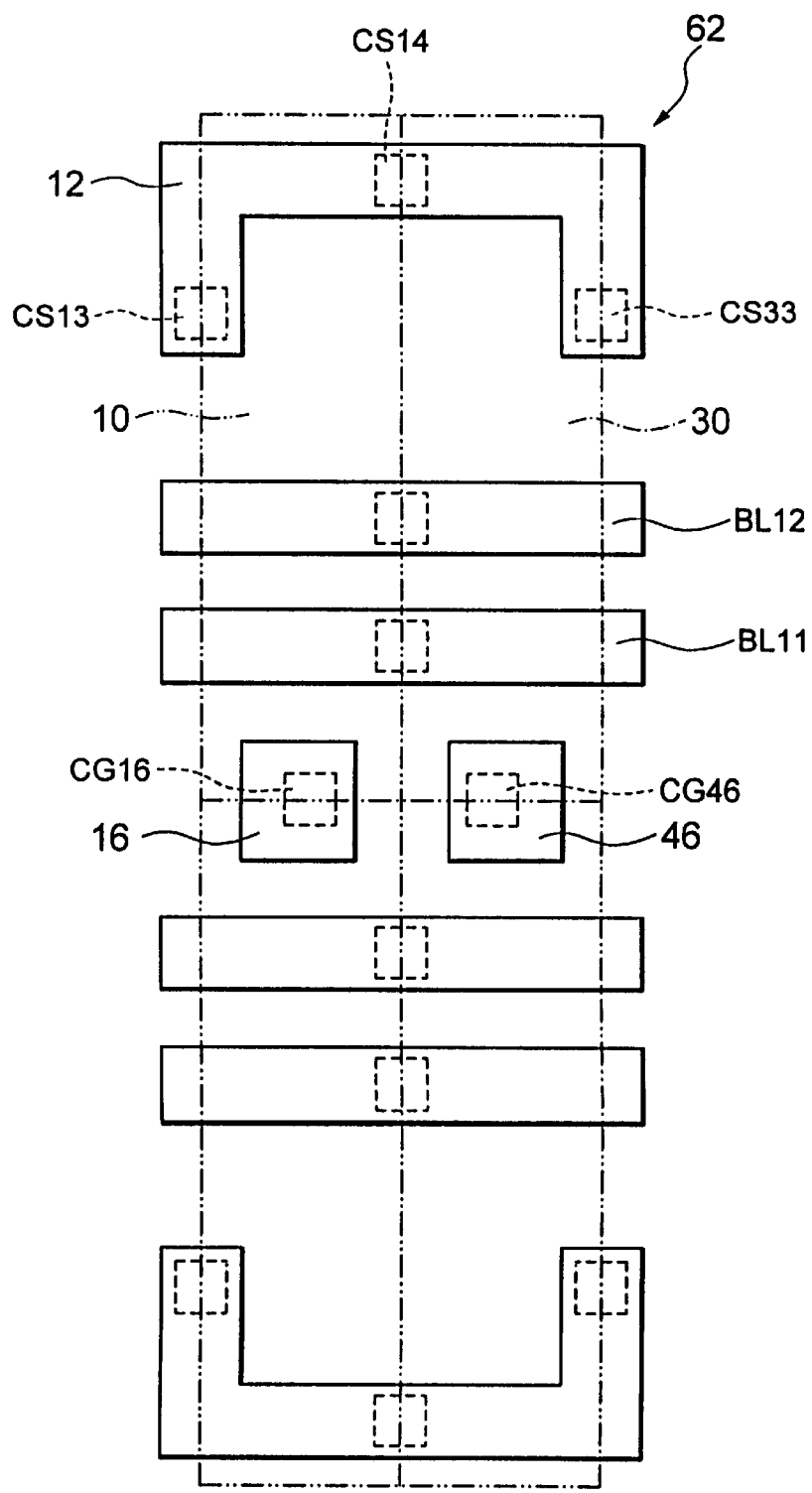
FIG. 15 is a schematic view showing a relationship between a second metal interconnect layer and contact plugs connected therebeneath in the second embodiment.
Figure 16:
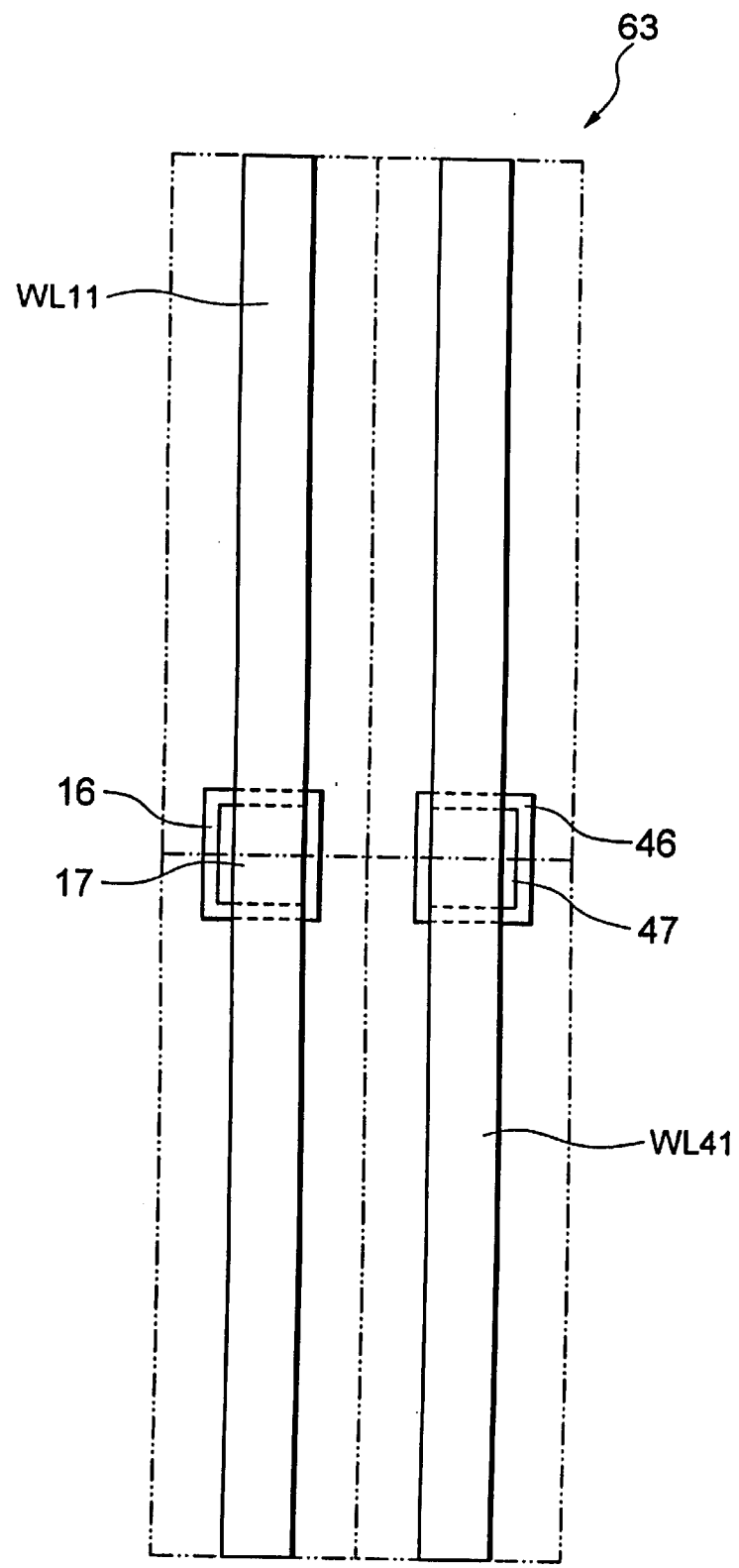
FIG. 16 is a schematic view showing a relationship between a third metal interconnect layer and a conductive layer connected therebeneath in the second embodiment.

FIG. 13 is a schematic view showing a relationship between a gate electrode and a diffused layer and contact plugs connected to them in the second embodiment. FIG. 14 is a schematic view showing a relationship between a first metal interconnect layer and contact plugs connected thereebeneath in the second embodiment. FIG. 15 is a schematic view showing a relationship between a second metal interconnect layer and contact plugs connected therebeneath in the second embodiment. FIG. 16 is a schematic view showing a relationship between a third metal interconnect layer and a conductive layer connected therebeneath in the second embodiment. In the second embodiment shown in FIGS. 13 to 16, the same components as in the first embodiment shown in FIGS. 5 to 8 are denoted by the same reference numerals and their detailed description is omitted.

In the second embodiment, a contact plug CG16 is provided on the central part of the gate poly-silicon layer G11 as shown FIG. 13. That is, the contact plug CG16 is disposed on the borderline between the first memory cell 10 and the second memory cell 20 sharing the gate poly-silicon layer G11. Similarly, a contact plug CG46 is provided on the central part of the gate poly-silicon layer G31. That is, the contact plug CG46 is disposed on the borderline between the third memory cell 30 and the fourth memory cell 40 sharing the gate poly-silicon layer G31.

As shown FIG. 15, interconnect lines 16 and 46 connected to the contact plugs CG16 and CG46, respectively, are formed in the second metal interconnect layer 62. Through holes are formed in the fourth interlayer insulating layer 54 formed on the second metal interconnect layer 62 at positions coinciding with the interconnect lines 16 and 46.

As shown in FIG. 16, conductive layers 17 and 47 are embedded in these through holes, respectively. Word lines WL11 and WL41 connected to the conductive layers 17 and 47, respectively, embedded in the through holes are formed in the third metal interconnect layer 63. The word lines WL11 and WL41 are extended in the longitudinal direction of the cells, and shared among the four transistor memory cells.

In the second embodiment constituted as described above, since the positions of the contact plugs for a gate poly-silicon layer constituting gate electrodes of the access transistor are the only difference from those in the first embodiment, the same effects as in the first embodiment can be obtained. That is, the occupied area is reduced and defects during the fabricating processes are reduced, and thereby high-speed operation is enabled.

Thus, since the first and second transistors (access transistors) connected to a bit line pair are disposed in the longitudinal direction of the memory cells in the semiconductor storage device having four-transistor memory cells according to the present invention, the source/drain diffused layer of each transistor can be provided to be extended in the short direction, and thereby the occupied area can be reduced. Consequently, since the word lines and the bit lines can be disposed to be extended in the longitudinal direction and in the short direction, respectively, the bit line length can be substantially shortened so that higher-speed operation is enabled due to the reduction of the bit line capacitance.

In addition, since the word lines are constituted by a metal layer, resistance and capacitance of the word lines are reduced, and thereby even higher-speed operation is enabled. Furthermore, since no bend is formed in any diffused layer, not only the occupation area can be reduced, but also the length and width can be controlled in the fabricating processes. Therefore, the one having characteristics as designed can be readily fabricated.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A semiconductor storage device provided with four-transistor memory cells comprising:

two bit lines constituting a pair;

first and second transistors of a first conductive type of which sources are connected to said two bit lines, respectively, said first and second transistors being disposed in a channel width direction of said first and second transistors and in the longitudinal direction of said four-transistor memory cell on a semiconductor substrate;

a third transistor of a second conductive type of which drain is connected to a drain of said first transistor, of which gate is connected to a drain of said second transistor and of which source is grounded; and a fourth transistor of the second conductive type of which drain is connected to the drain of said second transistor, of which gate is connected to the drain of said first transistor and of which source is grounded.

2. The semiconductor storage device according to claim 1, further comprising:

a poly-silicon layer which constitutes the gate electrodes of said first and second transistors and is extended in the longitudinal direction of said four-transistor memory cell; and a word line which is extended in the longitudinal direction of said four-transistor memory cell and is constituted by a metal layer connected to said poly-silicon layer.

3. The semiconductor storage device according to claim 2, wherein said poly-silicon layer is shared between two four-transistor memory cells adjacent to each other in the longitudinal direction of said four-transistor memory cell, and said word line is shared among a plurality of four-transistor memory cells disposed in the longitudinal direction of said four-transistor memory cell.

4. The semiconductor storage device according to claim 2, wherein said word line is connected to said poly-silicon layer via a conductive layer embedded in only one contact hole on said poly-silicon layer.

5. The semiconductor storage device according to claim 3, wherein said word line is connected to said poly-silicon layer via a conductive layer embedded in only one contact hole on the poly-silicon layer.

6. The semiconductor storage device according to claim 1, wherein said two bit lines are extended in the short direction of said four transistor memory cell and shared among a plurality of four-transistor memory cells disposed in the direction.

7. The semiconductor storage device according to claim 1, wherein source diffused layers and drain diffused layers of said first to fourth transistors have no bend and are extended in the short direction of said four-transistor memory cell.

8. The semiconductor storage device according to claim 1, further comprising:

a poly-silicon layer which constitutes gate electrodes of said first and second transistors and is extended in the longitudinal direction of said four-transistor memory cell;

an interconnect line which connects a drain diffused layer of said first transistor, a drain diffused layer of said third transistor and a gate electrode of said fourth transistor;

a ground interconnect line connected to source diffused layers of said third and fourth transistors; and a word line which is extended in the longitudinal direction of said four-transistor memory cell and is constituted by a metal layer connected to said poly-silicon layer.

9. The semiconductor storage device according to claim 8, wherein said poly-silicon layer and said word line are connected to each other via a conductive layer embedded in only one contact hole on said poly-silicon layer, said contact hole being provided in one of two four-transistor memory cells sharing said poly-silicon layer.

10. The semiconductor storage device according to claim 8, wherein said poly-silicon layer and said word line are connected to each other via a conductive layer embedded in only one contact hole on said poly-silicon layer, said contact hole being provided at the border of two four-transistor memory cells sharing said poly-silicon layer.

* * * * *